(12) United States Patent
Bae et al.

(10) Patent No.: US 8,492,075 B2
(45) Date of Patent: *Jul. 23, 2013

(54) METHODS OF FORMING ELECTRONIC DEVICES

(75) Inventors: Young Cheol Bae, Weston, MA (US); Thomas Cardolaccia, Newton, MA (US); Yi Liu, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 173 days.

This patent is subject to a terminal disclaimer.

(21) Appl. No.: 12/825,150

(22) Filed: Jun. 28, 2010

(65) Prior Publication Data

US 2010/0330499 A1    Dec. 30, 2010

Related U.S. Application Data

(60) Provisional application No. 61/269,600, filed on Jun. 26, 2009, provisional application No. 61/281,681, filed on Nov. 19, 2009.

(51) Int. Cl.
  *G03F 7/00* (2006.01)
  *G03F 7/004* (2006.01)
  *G03F 7/20* (2006.01)
  *G03F 7/40* (2006.01)

(52) U.S. Cl.
  USPC ............ 430/312; 430/270.1; 430/271.1; 430/273.1; 430/322; 430/330; 430/331

(58) Field of Classification Search
  USPC ............ 430/270.1, 271.1, 273.1, 312, 322, 430/330, 331
  See application file for complete search history.

(56) References Cited

U.S. PATENT DOCUMENTS

| | | | |
|---|---|---|---|
| 5,100,969 A * | 3/1992 | Yamamoto et al. | 525/327.2 |
| 8,003,295 B2 * | 8/2011 | Hatakeyama | 430/270.1 |
| 8,067,146 B2 * | 11/2011 | Jung | 430/311 |
| 2004/0121615 A1 * | 6/2004 | Kaneko et al. | 438/758 |
| 2006/0003271 A1 * | 1/2006 | Clark et al. | 430/329 |
| 2006/0127816 A1 * | 6/2006 | Kang et al. | 430/312 |
| 2008/0166665 A1 * | 7/2008 | Jung | 430/313 |
| 2008/0199814 A1 | 8/2008 | Brzozowy et al. | |
| 2009/0253078 A1 * | 10/2009 | Bekiaris et al. | 430/312 |
| 2009/0253080 A1 * | 10/2009 | Dammel et al. | 430/324 |
| 2010/0090372 A1 * | 4/2010 | Ishikawa et al. | 264/342 R |
| 2010/0273112 A1 * | 10/2010 | Hata et al. | 430/325 |
| 2010/0273113 A1 * | 10/2010 | Hata et al. | 430/325 |
| 2010/0330471 A1 | 12/2010 | Bae et al. | |
| 2010/0330498 A1 | 12/2010 | Bae et al. | |
| 2010/0330500 A1 | 12/2010 | Bae et al. | |
| 2010/0330501 A1 | 12/2010 | Bae et al. | |
| 2010/0330503 A1 | 12/2010 | Bae et al. | |
| 2011/0008729 A1 | 1/2011 | Bae et al. | |
| 2011/0117490 A1 | 5/2011 | Bae et al. | |

FOREIGN PATENT DOCUMENTS

EP    1975718 A2 * 10/2008

* cited by examiner

*Primary Examiner* — Amanda C. Walke
(74) *Attorney, Agent, or Firm* — Jonathan D. Baskin

(57) ABSTRACT

Methods of forming electronic devices are provided. The methods involve alkaline treatment of photoresist patterns and allow for the formation of high density resist patterns. The methods find particular applicability in semiconductor device manufacture.

9 Claims, 1 Drawing Sheet

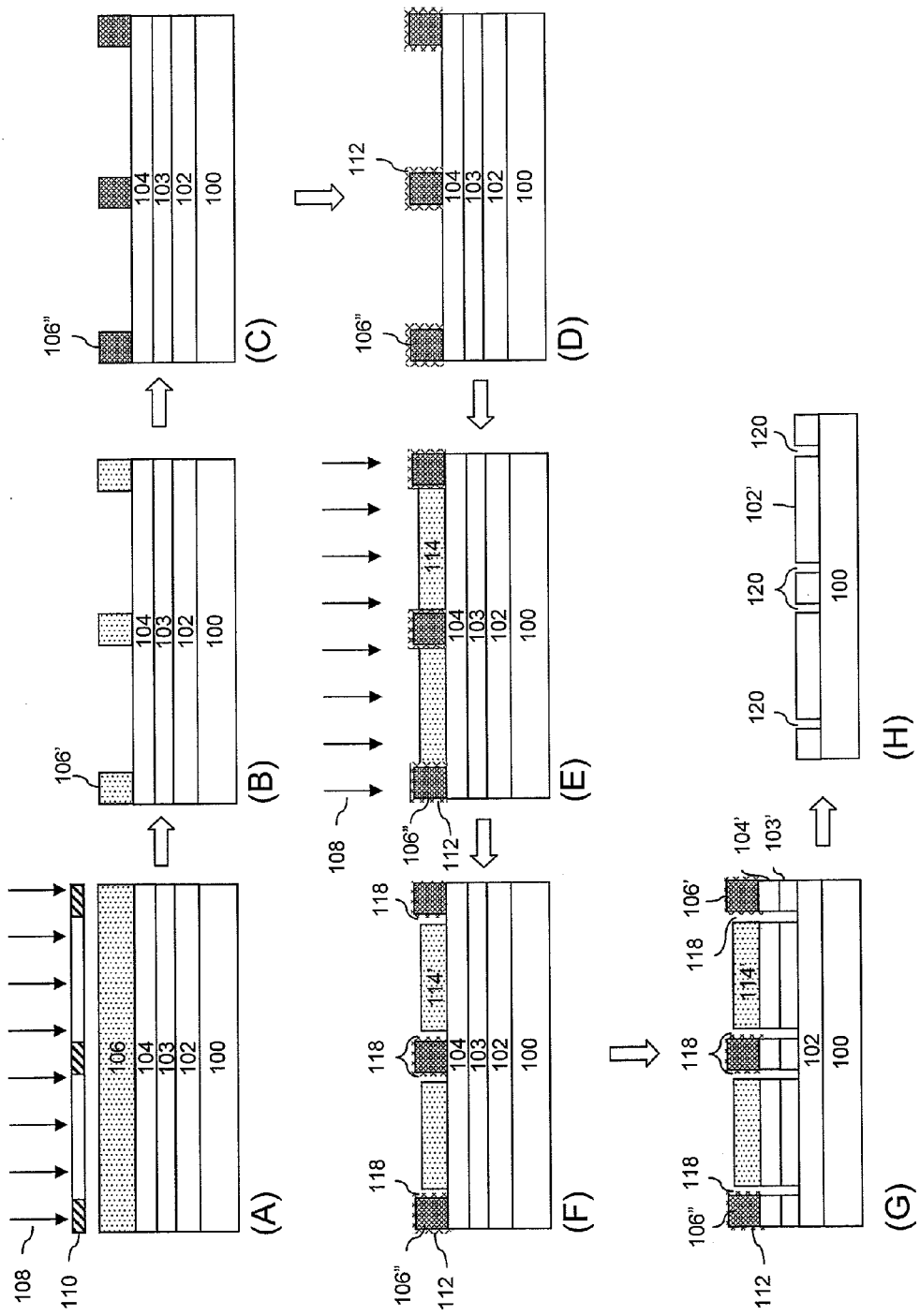

METHODS OF FORMING ELECTRONIC DEVICES

This application claims the benefit of priority under 35 U.S.C. §119(e) to U.S. Provisional Application Nos. 61/269,600, filed Jun. 26, 2009 and 61/281,681, filed Nov. 19, 2009, the entire contents of which applications are incorporated herein by reference.

This invention relates generally to the manufacture of electronic devices. More specifically, this invention relates to methods of forming photolithographic patterns. The invention finds particular use in the manufacture of semiconductor devices for forming high-density lithographic patterns and features.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

The theoretical resolution limit as defined by the Rayleigh equation is shown below:

$$R = k_1 \frac{\lambda}{NA}$$

where $k_1$ is the process factor, $\lambda$, is the wavelength of the imaging tool and NA is the numerical aperture of the imaging lens. When using water as the immersion fluid, the maximum numerical aperture can be increased, for example, from 1.2 to 1.35. For a $k_1$ of 0.25 in the case of printing line and space patterns, 193 nm immersion scanners would only be capable of resolving 36 nm half-pitch line and space patterns. The resolution for printing contact holes or arbitrary 2D patterns is further limited due to the low aerial image contrast with a dark field mask wherein the theoretical limit for $k_1$ is 0.35. The smallest half-pitch of contact holes is thus limited to about 50 nm. The standard immersion lithography process is generally not suitable for manufacture of devices requiring greater resolution.

In an effort to achieve greater resolution and to extend capabilities of existing manufacturing tools beyond theoretical resolution limits, various double patterning processes have been proposed, for example, self-aligned double patterning (SADP), litho-etch-litho-etch (LELE) and litho-litho-etch (LLE) techniques. Such techniques as typically implemented, however, suffer from one or more disadvantages. SADP processes typically involve a relatively large number of process steps, thereby adversely affecting production throughput. Product contamination and defectivity can result from LELE techniques from transport of wafers back and forth between photolithography and etching processing modules, and from etching and resist removal processes themselves. LLE procedures involve formation and stabilization of a first lithographic (L1) resist pattern followed by formation of a second lithographic (L2) pattern. Various resist stabilization techniques have been proposed such as ion implantation, UV curing, thermal hardening, thermal curing and chemical curing. U.S. Patent Application Publication No. US 2008/0199814 A1, to Brzozowy et al, discloses an overcoat chemical curing technique in which the resist pattern is coated with a fixer solution comprising a solvent, a fixer compound containing at least two functional groups reactive with an anchor group in a resist polymer, and optional additives such as catalysts, surfactants and polymers. While LLE processes involve fewer process steps than SADP and LELE, it can be difficult to avoid: pattern deformation during resist stabilization; intermixing between L1 and L2 resist layers during the L2 resist coating/soft bake process; and development of L1 patterns during the L2 exposure/develop process.

There is a continuing need in the art for photolithographic patterning methods which address one or more of the foregoing problems associated with the state of the art.

In accordance with a first aspect of the invention, methods of forming electronic devices are provided. The methods comprise: (a) providing a semiconductor substrate comprising one or more layers to be patterned; (b) applying a first layer of a first photosensitive composition over the one or more layers to be patterned, wherein the first photosensitive composition comprises a first resin component and a first photoactive component; (c) exposing the first layer to activating radiation through a patterned photomask; (d) developing the exposed first layer to form a first resist pattern; (e) heat treating the first resist pattern in a hardbake process; (f) treating the hardbaked first resist pattern with a material effective to make alkaline a surface of the first resist pattern; (g) applying a second layer of a second photosensitive composition over the one or more layers to be patterned and in contact with the alkaline surface of the first resist pattern, wherein the second photosensitive composition comprises a second resin component and a photoacid generator and is negative-acting; (h) exposing the second layer to activating radiation; and (i) developing the exposed second layer to form a second resist pattern, wherein regions of the second layer in the vicinity of the first resist pattern are removed to define openings between the first and second resist patterns.

In accordance with a further aspect of the invention, coated substrates are provided. The coated substrate comprise: (a) a semiconductor substrate comprising one or more layers to be patterned; (b) a resist pattern over the one or more layers to be patterned, the resist pattern having an alkaline surface; and (c) a layer of a photosensitive composition over the one or more layers to be patterned and in contact with the alkaline surface of the resist pattern, wherein the photosensitive composition comprises a second resin component and a photoacid generator and is negative-acting.

The present invention will be discussed with reference to the following drawing, in which:

FIG. 1A-H illustrates a process flow for a pattern formation process in accordance with the invention.

The pattern formation process of the invention can be applied, for example, to shrink processes useful in the formation of trenches or other device features in electronic device fabrication. FIG. 1A depicts a substrate 100 which may include various layers and features formed on a surface thereof. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example: chemical vapor deposition (CVD) such as plasma-enhanced CVD, low-pressure CVD or epitaxial growth; physical vapor deposition (PVD) such as sputtering or evaporation; or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 103 can include a single layer or a plurality of layers of different materials. The hard mask layer can be formed, for example, by chemical or physical vapor deposition techniques.

A bottom antireflective coating 104 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm), ArF excimer laser light (193 nm), electron beams and soft x-rays. The antireflective coating 104 can comprise a single layer or a plurality of different layers. Suitable antireflective materials and methods of formation are known in the art. Antireflective materials are commercially available, for example, those sold under the AR trademark by Rohm and Haas Electronic Materials LLC (Marlborough, Mass. USA), such as AR™40A and AR™124 antireflectants.

A first photosensitive composition is applied on the substrate over the antireflective layer 104 (if present) to form a first photosensitive layer 106. The first photosensitive composition comprises a resin component and a photoactive component. As used herein, the terms "photosensitive material(s)", "photosensitive composition(s)" and "photoresist(s)" are used interchangeably. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. The photoresist materials useful in the methods of the invention for foaming a first resist pattern include both positive- and negative-acting materials.

Suitable positive-acting materials include positive-acting chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

Suitable negative-acting resists typically will contain a crosslinking component. The crosslinking component is typically present as a separate resist component. Amine-based crosslinkers such as a melamine, for example, the Cymel melamine resins, are typical. Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof are disclosed in European Patent Nos. EP0164248B1 and EP0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125. For imaging at sub-200 nm wavelengths such as 193 nm, typical negative-acting photoresists are disclosed in International Application Pub. No. WO 03077029.

The resin of the first photosensitive composition preferably has functional groups that impart alkaline aqueous developability to the resist composition. For example, typical are resin binders that comprise polar functional groups such as hydroxyl or carboxylate. The resin component is used in the composition in an amount sufficient to render exposed regions in the case of a positive-acting material, or unexposed regions in the case of a negative-acting material, of the composition developable in a developer solution, such as an aqueous alkaline solution. The resin component will typically comprise about 70 to about 97 wt % of total solids of the resist.

The photosensitive composition further comprises a photoactive component employed in an amount sufficient to generate a latent image in a coating layer of the composition upon exposure to activating radiation. For example, the photoactive component will suitably be present in an amount of from about 1 to 20 wt % of total solids of the resist. Typical photoactive components in the resist compositions are one or more photoacid generator. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

The photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EUV and 157 nm. In an exemplary aspect, the photoresists are suitable for use with and imaged at a sub-200 nm wavelength such as 193 nm. At such wavelengths, the use of immersion lithography is typical although dry processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photosensitive composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the first photosensitive layer 106 is from about 500 to 1500 Å. The first photosensitive layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photosensitive layer and thickness. Typical softbakes are conducted at a temperature of from about 90 to 150° C., and a time of from about 30 to 90 seconds.

If the first photosensitive layer 106 is to be exposed with an immersion lithography tool, for example a 193 nm immersion scanner, a topcoat layer (not shown) can be disposed over the photosensitive layer 106. Use of such a topcoat layer can act as a barrier between the immersion fluid and underlying photosensitive layer. In this way, leaching of components of the photosensitive composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and are otherwise known in the art, for example, those described in U.S. Patent Application Pub. No. 2006/0246373A1 and in U.S. Provisional Application Nos. 61/204,007, filed Dec. 31, 2008. Such compositions can be applied over the photosensitive layer by any suitable method such as described above with reference to the photosensitive compositions, with spin coating being typical. The topcoat layer thickness is typically λ/4n (or an odd multiple thereof), wherein λ is the wavelength of the exposure radiation and n is the refractive index of the topcoat layer. If a topcoat layer is present, the first photosensitive layer 106 can be softbaked after the topcoat layer composition has been applied rather than prior to topcoat application. In this way, the solvent from both layers can be removed in a single thermal treatment step.

The first photosensitive layer 106 is next exposed to activating radiation 108 through a first photomask 110 to create a difference in solubility between exposed and unexposed regions. For a positive-acting material, as illustrated, the photomask has optically transparent and optically opaque regions, the optically transparent regions corresponding to regions of the photosensitive layer to be removed in a subsequent development step. For negative-acting materials, the optically opaque regions would correspond with portions of the resist layer to be developed away. The exposure energy is typically from about 1 to 100 mJ/cm$^2$, dependent upon the exposure tool and the components of the photosensitive composition. References herein to exposing a photosensitive composition to radiation that is activating for the composition indicates that the radiation is capable of forming a latent image in the photosensitive composition such as by causing a reaction of the photoactive component, for example, by producing photoacid from a photoacid generator compound. The photosensitive compositions are typically photoactivated by a short exposure wavelength, particularly a sub-400 nm, sub-300 or sub-200 nm exposure wavelength, with I-line (365 nm), 248 nm and 193 nm being typical exposure wavelengths, as well as EUV and 157 nm.

Following exposure of the first photosensitive layer 106, a post-exposure bake (PEB) of the photosensitive layer is typically performed at a temperature above the softening point of the layer. The PEB can be conducted, for example, on a hotplate or in an oven. Conditions for the PEB will depend, for example, on the particular material of the photosensitive layer and thickness. The PEB is typically conducted at a temperature of from about 80 to 150° C., and a time of from about 30 to 90 seconds.

The exposed photosensitive layer 106 is next developed to form a first resist pattern 106' as shown in FIG. 1B. While the developer material will depend on the particular material of the photosensitive layer 106, suitable developers and development techniques are known in the art. Typical developers include, for example, aqueous base developers such as quaternary ammonium hydroxide solutions, for example, tetraalkyl ammonium hydroxide solutions such as 0.26 N tetramethylammonium hydroxide.

Following development, the first resist pattern 106' is heat-treated in a first hardbake process to dry the pattern and form a hardened resist pattern 106", as shown in FIG. 1C. This heat-treatment is believed to facilitate adsorption of the subsequently applied surface treatment chemistry to the resist pattern. The hardbake is typically conducted with a hot plate or oven, and is typically conducted at a temperature of about 150° C. or higher, for example, from about 170 to 180° C., and a time of from about 30 to 120 seconds.

With reference to FIG. 1D, the hardbaked first resist pattern 106" is treated with a material effective to make alkaline a surface of the resist pattern. The alkaline surface interferes with reaction during exposure of a subsequently applied photosensitive layer over the resist pattern. For example, in the case of a negative-acting photosensitive layer, acid-catalyzed deprotection reaction is prevented in regions in the immediate vicinity of the underlying alkaline-treated resist pattern. In the case of an acid-catalyzed negative-acting photosensitive layer for the overcoated layer, polymerization would be inhibited in that layer in the immediate vicinity of the alkaline-treated resist pattern.

While not limited thereto, particularly suitable materials for the surface treatment comprise an alkaline material and a surfactant which is different from the alkaline material. It is believed that the surfactant promotes formation of a substantially uniform coating layer of the second resist over the alkaline material treated resist pattern.

The alkaline material can take various forms, and may be in the form of a solution formed by dissolving a solid compound in a suitable solvent. Suitable alkaline materials for the resist pattern treatment include, for example, aqueous base developers such as quaternary ammonium hydroxide solutions, for example, tetra-alkyl ammonium hydroxide solutions such as 0.26 Normality (N) (2.38 wt %) tetramethylammonium hydroxide (TMAH). Solvent materials used for the alkaline material and otherwise in the compositions should not dissolve or minimize dissolution of the underlying photoresist The alkaline material (absent any solvent, e.g., water, alcohol or the like) is typically present in the compositions in an amount of from about 1 to 10 wt %, based on the total composition.

Suitable surfactants for the resist pattern treatment compositions include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

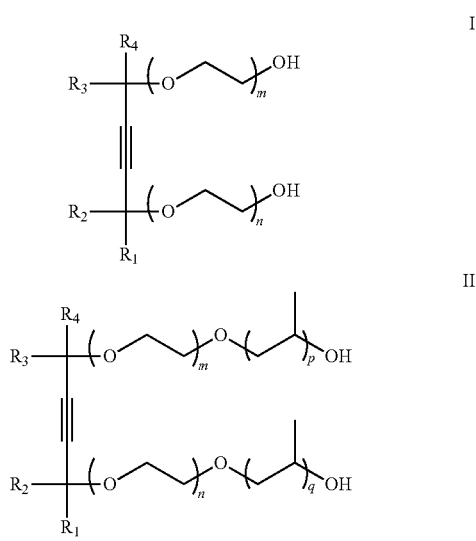

wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Particularly suitable surfactants include amines, typically primary and secondary amines, i.e., an amine including one or more primary amine groups and one or more secondary amine groups, respectively, and combinations thereof. Tertiary amine groups can be present in addition to the primary and/or secondary amine groups. Typically, the amine is a multifunctional amine. The amine can be a polyamine, such as a diamine, triamine or tetra-amine. Suitable primary amines include compounds of the following formula (I):

wherein R is chosen from optionally substituted alkyl such as optionally substituted C1 to C6 alkyl, such as methyl, ethyl or propyl, with ethyl being typical. Other suitable primary amines include poly(allyl amines) represented by the following formula (II):

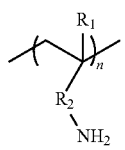
(II)

wherein: $R_1$ is chosen from hydrogen and optionally substituted alkyl such as C1 to C3 alkyl; $R_2$ is chosen from optionally substituted alkylene such as C1 to C6 alkylene, typically methylene or ethylene; and n is an integer greater than or equal to 3. In an exemplary primary amine of the formula (N-II), $R_1$ is hydrogen and $R_2$ is methylene. Other suitable amines include those represented by the following general formulae (III), (IV) and (V):

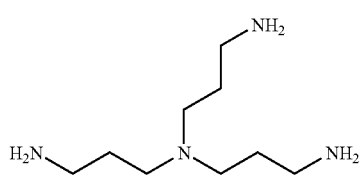
(III)

(IV)

(V)

wherein $R_1$ and $R_2$ are each independently a hydrogen atom or an alkyl group with 1 to 10 carbon atoms, and n is an integer from 1 to 10. Other suitable amines include the following:

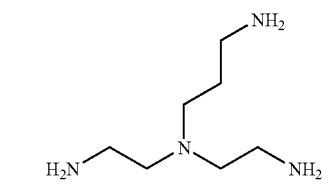
A-1

A-2

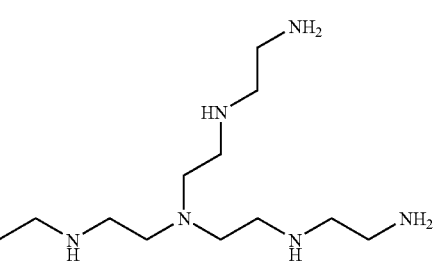
A-3

A-4

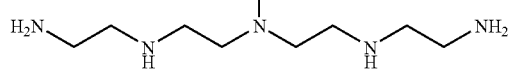
A-5

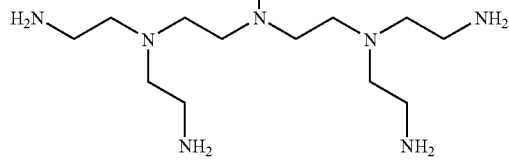
A-6

A-7

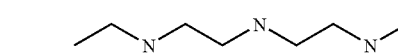
A-8

A-9

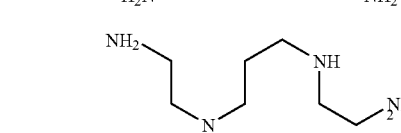

Of these, tris(2-aminoethyl)amine (TAEA) is particularly preferred.

The surfactant is typically present in the compositions in a relatively small amount, for example, from 0.01 to 5 wt %, for example, from 0.01 to 1 wt %, based on the weight of total solids in the composition (total solids being all compositions components except solvent carrier).

The resist pattern treatment compositions can comprise one or more optional components in addition to the alkaline material and surfactant components. For example, the compositions can include one or more solvent in addition to any solvent used for the alkaline material and surfactant. As described above, solvent materials used for the alkaline material and otherwise in the compositions should not dissolve or minimize dissolution of the underlying photoresist. Suitable solvents will therefore depend on the particular underlying resist material and may include, for example, water and alcohols such as n-butanol. The optional components also include one or more base generator compound, such as a thermal base generator compound and/or a photobase generator compound.

The photoresist pattern treatment compositions can be prepared by admixture in any order of the alkaline material and surfactant components, and any additional components such as solvent and base generator compounds. One or more of the components can be added as a solid or as a pre-mixed solution using a suitable solvent.

Preferably, the alkaline treatment includes treatment with a quaternary ammonium hydroxide and an amine. The quaternary ammonium hydroxide material and amine can be simultaneously applied to the substrate, for example, either from a premixed composition or by applying the materials simultaneously but separate from one another in which case the composition is formed in situ. Preferably, the quaternary ammonium hydroxide material and amine are sequentially applied in that order. The quaternary ammonium hydroxide and amine materials can be applied as a liquid, gas or vapor, and can be applied, for example, by spin-coating, dipping, vapor-coating, chemical vapor deposition (CVD) or other conventional coating technique. Of these, spin-coating of liquid materials is typical. Typically, the quaternary ammonium hydroxide and amine materials can be applied as aqueous solution(s). Where the quaternary ammonium hydroxide and amine are applied simultaneously, the surface treated substrate can be rinsed, for example, with deionized water. Where the quaternary ammonium hydroxide and amine materials are sequentially applied, the amine can be applied as an aqueous solution, functioning also as a water rinse. The surface treated substrate can optionally be rinsed, for example, with deionized water to remove excess composition.

A critical dimension (CD) of the first resist pattern 106" becomes slightly reduced as a result of the surface treatment as compared with the original CD of resist pattern 106'. This CD loss is believed to be attributed to further development of the first resist pattern during the surface treatment. The surface treatment forms a modified first resist pattern surface 112 which is alkaline and which has a line width roughness less than that of the pre-treated surface.

A layer of a second photosensitive composition 114 is coated over the substrate to a thickness less than or equal to the thickness of the first resist pattern 106", as shown in FIG. 1E. While the first photosensitive composition can be a positive-acting or negative-acting material, the second photosensitive composition is negative-acting. Except as otherwise stated, the second photosensitive composition can be applied and processed in the same manner including the materials and conditions described above for a negative-acting first photosensitive layer. In the illustrated process flow, the first photosensitive composition is positive acting while the second photosensitive composition is negative-acting. Where the first resist layer 106 is positive-acting, its composition should be chosen so as to provide a resist layer having a characteristic post-exposure bake temperature that is higher than that of the second photosensitive layer. In this way, the exposed regions of the second photosensitive layer can be selectively removed without also removing exposed regions of the first resist.

The second photosensitive layer 114 can next be softbaked. If the second photosensitive layer 114 is to be exposed with an immersion lithography tool, a topcoat layer (not shown) as described above can be disposed over the second photosensitive layer 114. If a topcoat layer is used, the second photosensitive layer 114 can be softbaked after the topcoat layer composition has been applied rather than prior to its application.

With reference to FIG. 1(E), the second photosensitive layer 114 is exposed to activating radiation 108, typically by flood-exposure, i.e., without use of a patterned photomask. The exposed second photosensitive layer is heat-treated in a post-exposure bake and developed. The alkaline-modified surface region 112 of the first resist pattern 106" prevents photoreaction in the second resist layer 114 in the vicinity of the surface region. The exposure and heat treatment causes polymerization of the second photosensitive layer in all areas except in the immediate vicinity of the alkaline-treated first resist pattern 106". In this way, development removes only that material in the immediate vicinity of the first resist pattern 106", leaving narrow spaces 118 between the first and second resist patterns 106", 114', as shown in FIG. 1F.

The BARC layer 104 is selectively etched using the first and second resist patterns 106", 114' as an etch mask, exposing the underlying hardmask layer 103. The hardmask layer is next selectively etched, again using the first and second resist patterns as an etch mask, resulting in patterned BARC and hardmask layers 104', 103', as shown in FIG. 1G. Suitable etching techniques and chemistries for etching the BARC layer and hardmask layer are known in the art and will depend, for example, on the particular materials of these layers. Dry-etching processes such as reactive ion etching are typical. The first and second resist patterns 106", 114' and patterned BARC layer 104' are next removed from the substrate using known techniques, for example, oxygen plasma ashing.

Using the hardmask pattern 103' as an etch mask, the one or more layers 102 are selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting patterned structure is a pattern of etched features 120 such as trenches as illustrated in FIG. 1I. In an alternative exemplary method, it may be desirable to pattern the layer 102 directly using the first and second resist patterns 106", 114' without the use of a hardmask layer 103. Whether such direct patterning can be employed will depend on factors such as the materials involved, resist selectivity, resist pattern thickness and pattern dimensions.

The following non-limiting examples are illustrative of the invention.

EXAMPLES

Example 1

L1 Resist Polymer
(Poly(IAM/α-GBLMA/ODOTMA/HAMA))
Synthesis 10.51 g of 2-methyl-acrylic acid 1-isopropyl-adamantanyl ester (IAM), 6.82 g of 2-methyl-acrylic acid 2-oxo-tetrahydro-furan-3yl ester (α-GBLMA), 6.36 g of 2-methyl-acrylic acid 3-oxo-4,10-dioxa-tricyclo[$5.2.1.0^{2,6}$]dec-8-yl ester (ODOTMA) and 6.31 g of 2-methyl-acrylic acid 3-hydroxy-adamantanyl ester (HAMA) are dissolved in 27 g of tetrahydrofuran (THF). The mixture is degassed by bubbling with nitrogen for 20 minutes. A 500 ml flask equipped with a condenser, nitrogen inlet and mechanical stirrer is charged with 11 g of THF, and the solution is brought to a temperature of 67° C. 5.23 g of dimethyl-2,2-azodiisobutyrate (17 mol % based on total monomers) is dissolved in 5 g of THF and is charged into the flask. The monomer solution is fed into a reactor at a rate of 16.0 milliliters per hour (mL/h) for 3 hours 30 minutes. The polymerization mixture is stirred for an additional 30 minutes at 67° C. 5 g of THF is next added to the reactor and the polymerization mixture is cooled to room temperature. Precipitation was carried out in 1.0 L of isopropyl alcohol. After filtration, the polymer was dried, re-dissolved in 50 g of THF, re-precipitated into 1.1 L of isopropyl alcohol, filtered and dried in a vacuum oven at 45° C. for 48 hours, resulting in 25.4 g of the poly(IAM/α-GBLMA/

ODOTMA/HAMA) polymer (Mw=7,934 and Mw/Mn=~1.46) shown below:

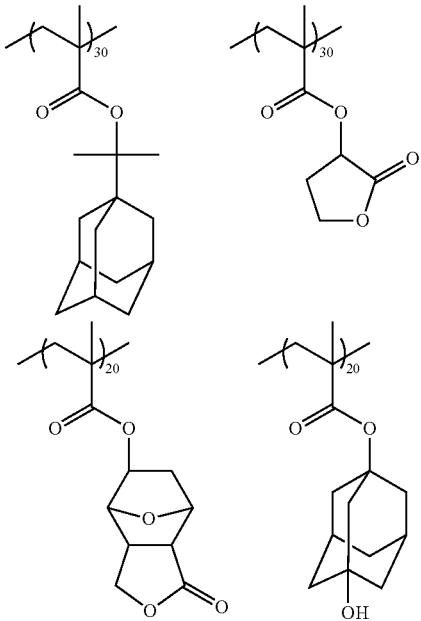

L1 Positive-Acting Photoresist Composition 3.169 g of the above polymer is dissolved in 96.38 g of a solvent mixture of 70 wt % propylene glycol monomethyl ether acetate (PGMEA) and 30 wt % cyclohexanone. To this mixture is added 0.405 g of triphenylsulfonium (adamantan-1yl methoxycarbonyl)-difluoro-methanesulfonate, 0.041 g of 1-(tert-butoxycarbonyl)-4-hydroxypiperidine and 0.005 g of POLYFOX® PF-656 surfactant (Omnova Solutions Inc.). The resulting mixture is rolled on a roller for six hours and then filtered through a Teflon filter having a 0.2 micron pore size to form a positive-acting photoresist composition.

L2 Negative-Acting Photoresist Composition 2.788 g of poly(4-hydroxy styrene) (VP3500 from Nisso, Japan) are dissolved in 96.500 g of propylene glycol monomethyl ether acetate (PGMEA). To this mixture is added 0.350 g of Powderlink-1174 (Cytec Industries, Woodland Park, N.J.), 0.350 g of triphenylsulfonium (adamantan-1yl methoxycarbonyl)-difluoro-methanesulfonate), 0.007 g of 1-(tert-butoxycarbonyl)-4-hydroxypiperidine and 0.005 g of POLYFOX® PF-656 surfactant (Omnova Solutions Inc.). The resulting mixture is rolled on a roller for six hours and then filtered through a Teflon filter having a 0.2 micron pore size, thereby forming a negative-acting photoresist composition.

Surface Treatment Solution Formulation

A surface treatment solution is prepared by mixing 5 g of 1 wt % tris(2-aminoethyl)amine (TAEA) (Sigma-Aldrich) solution in deionized water, 1 g of 10 wt % of a surfactant solution (TERGITOL TMN-6, The Dow Chemical Company, Midland, Mich., USA) and 194 g of deionized water. This solution is filtered through a nylon filter having a 0.1 micron pore size.

First Lithography (L1) Patterning of Lines and Spaces

A 300 mm silicon wafer is spin-coated with AR™40A antireflectant (Rohm and Haas Electronic Materials) to form a first bottom antireflective coating (BARC) on a TEL CLEAN TRACK™ LITHIUS™ i+coater/developer. The wafer is baked for 60 seconds at 215° C., yielding a first BARC film thickness of 75 nm. A second BARC layer is next coated over the first BARC using AR™124 antireflectant (Rohm and Haas Electronic Materials), and is baked at 205° C. for 60 seconds to generate a 23 nm top BARC layer.

The L1 photoresist composition is coated on top of the dual BARCs and is soft-baked at 110° C. for 60 seconds to provide a resist film thickness of 950 Å. The L1 resist layer is coated with a topcoat layer (OC™2000 topcoat material, Rohm and Haas Electronic Materials) and is exposed at various doses from 15 to 75 mJ/cm$^2$ through a reticle having various critical dimensions using an ASML TWINSCAN™ XT:1900i immersion scanner with a numerical aperture of 1.35 and dipole-35Y illumination (0.96 outer sigma/0.76 inner sigma) with X-polarization. The wafer is then post-exposure baked (PEB) at 100° C. for 60 seconds and is developed for 12 seconds using Microposit™ MF CD-26 developer (Rohm and Haas Electronic Materials) to render first lithography (L1) patterns.

Curing and Surface Treatment

The wafer is hardbaked at 180° C. for 60 seconds. The wafer is next exposed to surface treatment chemistry in a sequential process by which the wafer is first rinsed with 2.38 wt % TMAH in water solution for 12 seconds using a TEL GP nozzle, and is then rinsed with the surface treatment solution formulation described above.

Second Lithography (L2) Process

The L2 negative-acting resist formulation is coated over the surface-treated L1 patterns on the coater/developer at a spin speed that would provide a film thickness of 650 Å on a bare silicon wafer. The wafer is soft-baked at 120° C. for 60 seconds and then coated with a top-coat layer (OC™2000 topcoat material, Rohm and Haas Electronic Materials). The second lithography (L2) is carried out using the same scanner settings as in the first lithographic process but using flood exposure with no mask at various exposure doses of from 8 to 38 mJ/cm$^2$. The wafer is then post-exposure baked at 110° C. for 60 seconds and developed for 12 seconds using Microposit™ MF CD-26 developer (Rohm and Haas Electronic Materials). It would be expected that portions of the L2 resist layer in the vicinity of the L1 resist pattern would be removed by the development, leaving fine spaces defined between the L1 and L2 resist patterns.

Examples 2-43

The procedures of Example 1 are repeated except the surface treatment solutions are prepared by adding together the components of Table 1 and filtering through a nylon filter having a 0.1 micron pore size. It would be expected that portions of the L2 resist layer in the vicinity of the L1 resist pattern would be removed by the development, leaving fine spaces defined between the L1 and L2 resist patterns.

TABLE 1

| Ex. | Amine[1] | Surfactant[2] | DI Water (g) |
| --- | --- | --- | --- |
| 1 | A-1 (5 g) | S-1 (1 g) | 194 |
| 2 | A-1 (2.5 g) | — | 97.5 |
| 3 | A-1 (1 g) | — | 99 |
| 4 | A-1 (0.1 g) | — | 99.9 |
| 5 | A-1 (2.5 g) | S-2 (1 g) | 96.5 |
| 6 | A-1 (2.5 g) | S-1 (1 g) | 96.5 |
| 7 | A-1 (2.5 g) | S-1 (0.75 g) | 96.75 |
| 8 | A-1 (2.5 g) | S-1 (0.5 g) | 97 |
| 9 | A-1 (2.5 g) | S-3 (10 g) | 87.5 |
| 10 | A-1 (2.5 g) | S-4 (20 g) | 77.5 |
| 11 | A-1 (2.5 g) | S-5 (0.05 g) | 97.45 |
| 12 | A-1 (1 g) | S-1 (0.1 g) | 98.9 |
| 13 | A-1 (1 g) | S-1 (0.3 g) | 98.7 |

TABLE 1-continued

| Ex. | Amine[1] | Surfactant[2] | DI Water (g) |
|---|---|---|---|
| 14 | A-1 (1 g) | S-1 (0.5 g) | 98.5 |
| 15 | A-1 (2.5 g) | S-1 (0.1 g) | 97.4 |
| 16 | A-1 (2.5 g) | S-1 (0.3 g) | 97.2 |
| 17 | A-1 (5 g) | S-1 (0.1 g) | 94.9 |
| 18 | A-1 (5 g) | S-1 (0.3 g) | 94.7 |
| 19 | A-1 (5 g) | S-1 (0.5 g) | 94.5 |
| 20 | A-2 (1 g) | — | 99 |
| 21 | A-2 (1 g) | S-1 (1 g) | 98 |
| 22 | A-2 (2.5 g) | S-1 (1 g) | 96.5 |
| 23 | A-3 (1 g) | — | 99 |
| 24 | A-3 (1 g) | S-1 (1 g) | 98 |
| 25 | A-3 (2.5 g) | S-1 (1 g) | 96.5 |
| 26 | A-4 (1 g) | — | 99 |
| 27 | A-4 (1 g) | S-1 (1 g) | 98 |
| 28 | A-4 (2.5 g) | S-1 (1 g) | 96.5 |
| 29 | A-5 (1 g) | — | 99 |
| 30 | A-5 (1 g) | S-1 (1 g) | 98 |
| 31 | A-5 (2.5 g) | S-1 (1 g) | 96.5 |
| 32 | A-6 (1 g) | — | 99 |
| 33 | A-6 (1 g) | S-1 (1 g) | 98 |
| 34 | A-6 (2.5 g) | S-1 (1 g) | 96.5 |
| 35 | A-7 (1 g) | — | 99 |
| 36 | A-7 (1 g) | S-1 (1 g) | 98 |
| 37 | A-7 (2.5 g) | S-1 (1 g) | 96.5 |
| 38 | A-8 (1 g) | — | 99 |
| 39 | A-8 (1 g) | S-1 (1 g) | 98 |
| 40 | A-8 (2.5 g) | S-1 (1 g) | 96.5 |
| 41 | A-9 (1 g) | — | 99 |
| 42 | A-9 (1 g) | S-1 (1 g) | 98 |
| 43 | A-9 (2.5 g) | — | 96.5 |

[1] Amines are 1 wt % solutions in water and have the structures as defined above;
[2] S-1 = Tergitol ™ TMN-6, 10 wt % in water (The Dow Chemical Company, Midland, MI, USA); S-2 = Triton ™ X-100, 10 wt % in water (The Dow Chemical Company); S-3 = Tetronics ™ 304, 10 wt % in water (BASF Corporation, Florham Park, NJ USA); S-4 = Tetronics ™ 1307 (BASF Corporation, Florham Park, NJ USA); S-5 = Surfynol ™ 2502 (Air Products and Chemicals, Inc., Allentown, PA, USA).

What is claimed is:

1. A method of forming an electronic device, comprising:
   (a) providing a semiconductor substrate comprising one or more layers to be patterned;
   (b) applying a first layer of a first photosensitive composition over the one or more layers to be patterned, wherein the first photosensitive composition comprises a first resin component and a first photoactive component;
   (c) exposing the first layer to activating radiation through a patterned photomask;
   (d) developing the exposed first layer to form a first resist pattern;
   (e) heat treating the first resist pattern in a hardbake process;
   (f) treating the hardbaked first resist pattern in a spin coating process with a material effective to make alkaline a surface of the first resist pattern;
   (g) applying a second layer of a second photosensitive composition over the one or more layers to be patterned and in contact with the alkaline surface of the first resist pattern, wherein the second photosensitive composition comprises a second resin component and a photoacid generator and is negative-acting;
   (h) exposing the second layer to activating radiation by flood-exposure; and
   (i) developing the exposed second layer to form a second resist pattern, wherein regions of the second layer in the vicinity of the first resist pattern are removed to define openings between the first and second resist patterns.

2. The method of claim 1, wherein the first and second resist patterns define an opening for forming a trench.

3. The method of claim 1, further comprising etching one or more layer underlying the first and second resist patterns using the resist patterns as a mask.

4. The method of claim 1, wherein the heat treating the first resist pattern is conducted at a temperature of about 150° C. or higher.

5. The method of claim 1, wherein treating the hardbaked first resist pattern with the material effective to make alkaline a surface of the first resist pattern comprises treating the first resist pattern with an alkaline material and a surfactant.

6. The method of claim 1, wherein treating the hardbaked first resist pattern with the material effective to make alkaline a surface of the first resist pattern comprises treating the first resist pattern with a primary or secondary amine.

7. The method of claim 6, wherein treating the hardbaked first resist pattern with the material effective to make alkaline a surface of the first resist pattern comprises sequentially treating the first resist pattern with a quaternary ammonium hydroxide solution followed by the primary or secondary amine.

8. The method of claim 6, wherein the amine is a compound of the following formula (I):

(I)

wherein R is chosen from optionally substituted C1-C6 alkyl groups.

9. The method of claim 1, wherein the amine is chosen from compounds of the following formulae (III), (IV) and (V):

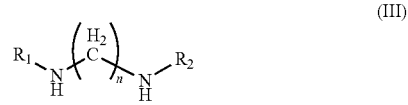

(III)

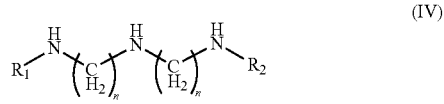

(IV)

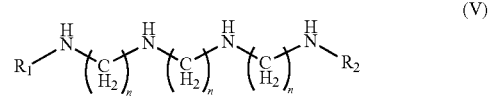

(V)

wherein $R_1$ and $R_2$ are each independently a hydrogen atom or a C1-C10 alkyl group; and n is an integer from 1 to 10.

* * * * *